United States Patent [19]

Baker et al.

[11] 4,198,564
[45] Apr. 15, 1980

[54] PYROELECTRIC DETECTOR CIRCUITS AND DEVICES

[75] Inventors: Geoffrey Baker, Ashurst; Alexander D. Annis, Haywards Heath, both of England

[73] Assignee: U.S. Philips Corporation, New York, N.Y.

[21] Appl. No.: 895,704

[22] Filed: Apr. 12, 1978

[30] Foreign Application Priority Data

Apr. 19, 1977 [GB] United Kingdom ............... 16110/77

[51] Int. Cl.$^2$ .............................................. G01J 1/00
[52] U.S. Cl. ................................................ 250/338
[58] Field of Search ....................... 250/338, 340, 352; 307/308, 310, 311; 328/1, 2, 3; 73/355 R, 355 EM

[56] References Cited

U.S. PATENT DOCUMENTS

| 3,539,803 | 11/1970 | Beerman | 250/338 |
| 4,024,560 | 5/1977 | Miller et al. | 250/338 X |
| 4,068,811 | 1/1978 | Caulier | 250/338 X |
| 4,078,179 | 3/1978 | Everest | 250/338 |

*Primary Examiner*—Davis L. Willis
*Attorney, Agent, or Firm*—Thomas A. Briody; William J. Streeter; Bernard Franzblau

[57] ABSTRACT

A radiation detector circuit including a pyroelectric detector element and field effect transistor amplifier means. In order to inhibit saturation of the amplifier means under conditions of large transients in the radiation input or progressive changes in radiation input of low magnitude, at least one ultra-low leakage non-linear device is connected in the part of the circuit including the gate electrode of the amplifier means and the detector element. In one embodiment a pair of picoampere diodes are reverse parallel connected across the detector element and the circuit is formed as a hybrid microcircuit device having three external terminal connections. In another embodiment the non-linear device is incorporated in a feedback path between the output side of an amplification stage and the detector element.

14 Claims, 6 Drawing Figures

PYROELECTRIC DETECTOR CIRCUITS AND DEVICES

THIS INVENTION relates to arrangements comprising a radiation detector element made of pyroelectric material and further relates to pyroelectric radiation detector devices.

The use of pyroelectric material for radiation detection, in particular infra-red radiation detection, is well established. The pyroelectric effect is the change of an electrical polarisation in a crystal due to a temperature change. The state of polarisation is not generally observable because under equilibrium conditions it is compensated by the presence of free carrier charges that have reached the surface of the crystal by conduction through the crystal and from outside. The magnitude of the polarisation, and hence of the compensating charge, depends on the temperature and when the temperature is changed so that the supply of compensating charges is less than the variation in the polarising charge then the crystal surfaces acquire an observable change. This effect is employed in detector devices by making the crystal into a capacitor with electrodes on oppositely located plane surfaces which are perpendicular to the polar axis of the crystal, the redistribution of the compensating charges causing a current to flow in a circuit including the capacitor and external to the crystal.

Pyroelectric elements of the said configuration are themselves responsive to changes in temperature and not to absolute temperature values. For a small temperature change dT, the change in the polarisation of a crystal is proportional to the temperature change, namely $dP = \lambda dT$ where $\lambda$ is referred to as the pyroelectric coefficient of the crystal. The current in the external circuit is proportional to the area of the radiation receiving electrode A and also to the rate at which the polarisation charge changes, namely $$I = A \frac{dP}{dt} = A\lambda \frac{dT}{dt}.$$

As infra-red radiation detectors pyroelectric elements as described are employed with associated amplifier means. These detectors may be operated such that the signal obtained from the amplifier means is directly related to changes in incident radiation on the element. In another mode the incident radiation is interrupted at a fixed frequency and the signal derived is a constant A.C. voltage at this frequency. An important parameter in a detector arrangement comprising a detector element and associated amplifier means is the noise which may arise from several sources including temperature or radiation noise, Johnson noise in the crystal, current noise in the amplifier means and voltage noise in the amplifier means.

One inherent problem that has occurred in the use of pyroelectric elements for the detection of small signal radiation has been the effect of large unwanted radiation input signal changes, for example the change in intensity of solar radiation under changing cloud conditions on the output circuitry and also the influence of a steady change of temperature in the region of 1° C. per minute or even less. As the element is a relatively high impedance device it is customary to locate a field effect transistor pre-amplifier stage, which forms part of the external circuitry, in the proximity of the detector element. However, in the case of a sudden change in input radiation or a steady change in temperature of the order mentioned above, the field effect transistor pre-amplifier will saturate. The problem of limiting the voltage rise produced under the said adverse conditions is that any means introduced into the external circuitry must not be such as to give rise to a noise factor which exceeds the inherent noise factor of the detector element itself.

Most efforts to reduce the saturation effect have hitherto been based on reducing the value of a high value gate leakage resistor connected across the detector element and hence to reduce the low frequency responsivity. This method has the basic disadvantage of increasing the noise of the detector.

According to a first aspect of the invention there is provided a circuit arrangement comprising a radiation detector element of pyroelectric material, field effect transistor amplifier means connected to the detector element and at least one ultra-low leakage non-linear device connected in the circuit including the gate electrode of the field effect transistor amplifier means and the detector element, said device serving to limit the excursion in one direction of the signal input to the field effect transistor amplifier means and thereby inhibit saturation under conditions of large transients in radiation input or under conditions of progressive changes in radiation input of low magnitude.

In such a circuit arrangement in which the pyroelectric element, the non-linear device element and the field effect transistor amplifier means may be embodied in the form of discrete circuit elements individually connected, or at least partly in the form of a hybrid microcircuit, as will be described hereinafter, the provision of the said non-linear device is effective in limiting the signal received by the field effect transistor amplifier means under most of the said conditions where hitherto saturation of the amplifier means occurred.

Reference herein to an ultra-low leakage non-linear device is to be understood to mean that the reverse current of the device at a reverse bias of 0.5 V must be less than 20 picoamperes and that the dynamic resistance of the device at zero bias is greater than $10^9$ ohms. The invention is based on the concept that hitherto the incorporation of voltage limiting devices across the pyroelectric element has not been possible due to the leakage currents of said devices being of a magnitude such as to generate unacceptable noise, or alternatively expressed in terms of the limiting impedance of the devices being insufficiently high to prevent impairment due to the noise associated with such an impedance. However, but with the availability of certain ultra-low leakage non-linear devices as will be described in detail hereinafter and having an internal resistance exceeding $10^{10}$ ohms at low bias levels the problem of the noise associated with such a resistance is no longer dominant and may be acceptable having regard to the advantages derived in inhibiting the occurrence of saturation of the field effect transistor amplifier means. Furthermore the provision of the ultra-low leakage non-linear device no longer necessitates the provision of a gate leakage resistor across the element and this may provide a cost saving in the manufacture of some detector devices, as will be described hereinafter.

In currently preferred forms of the arrangement a pair of ultra-low leakage diode elements (asymmetrical devices) are present in the said circuit including the gate electrode of the field effect transistor amplifier means and the detector element, said diode elements being connected in opposite sense and thereby serving to limit the excursion both in said one direction and the opposite direction. Furthermore, preferably said pair of diode elements are formed by anti-parallel connected p-n diodes. However in a modification said pair of diode elements are formed by series connected Schottky diode elements.

As an alternative it is possible to use two Schottky diodes which are connected in parallel in opposite sense.

Other possibilities for the ultra-low leakage non-linear device include the use of one or more backward diodes or one or more diodes formed by junction field effect transistor structures in which the source and drain electrodes are interconnected.

It is of course possible when using ultra-low leakage p-n diodes to connect the diodes in series in opposite sense. However it should be noted that with series connected diodes the signal limiting effect may not predominate when the reverse breakdown voltage is high.

When using two diode elements it is not essential in all applications that the individual diode elements have of identical characteristics. Thus in some instances it may be possible to use different types of diode element in the pair of elements.

According to a further aspect of the invention there is provided a radiation detector device comprising an envelope, an element of pyroelectric material located within the envelope such as to be in receipt of radiation to be detected, said element having first and second electrodes, a junction field effect transistor element situated in the envelope and having its gate electrode connected to the first electrode of the element of pyroelectric material, at least one ultra-low leakage non-linear device located within the envelope and electrically connected between said first electrode and a terminal connection extending from the envelope, the source and drain electrodes of the field effect transistor being connected to terminal connections extending from the envelope and the second electrode of the element of pyroelectric material being connected to a terminal connection extending from the envelope.

Such a detector device, which in some forms to be described hereinafter has three terminal connections and in some other forms also to be described hereinafter has four terminal connections, may be constructed in the form of a hybrid microcircuit which has considerable advantage, not only in terms of the circuit configuration as already described in the context of the first aspect of the invention, but also in terms of the structure. In particular by providing the field effect transistor element and the ultra-low leakage non-linear device in the same housing as the pyroelectric element, possible user problems of impedance matching and matching of the field effect transistor characteristics to the pyroelectric element characteristics need not arise. Furthermore by incorporating the elements in a common housing problems of electrical interference are reduced.

Embodiments of the invention will now be described, by way of example, with reference to the accompanying diagrammatic drawings, in which.

Figure 1:
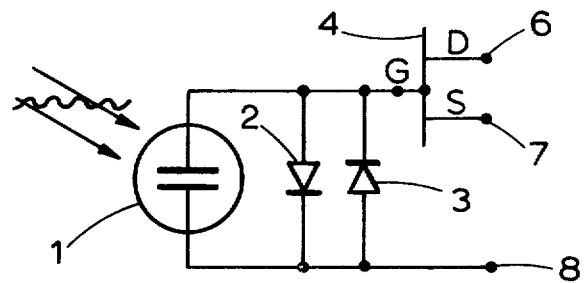
FIG. 1 is a circuit diagram of a device in accordance with the second aspect of the invention and forming an arrangement in accordance with the first aspect of the invention.

The circuit diagram shown in FIG. 1 is that of a device which comprises a detector element 1 of pyroelectric material, in the present case of PLMZT (Lead zirconate titanate with lanthanum and manganese dopants) and represented as a capacitor. For details of the pyroelectric material composition reference is invited to United Kingdom Pat. No. 1,504,283. Connected across the electrode connections of the element 1 are two ultra-low leakage diode elements 2 and 3. These diodes are connected in opposite sense, and in the present embodiment are formed by unencapsulated p-n diode chips of a form as normally present in Mullard Picoampere diodes type BAV 45, said chips being present in the same envelope as the element 1. However included within the scope of the invention is such a circuit arrangement in which the diode elements are formed by commercially available encapsulated diodes, for example Mullard type BAV 45 diodes or Siliconix types DPAD 1, DPAD 2 or DPAD 5, either within or external to the envelope in which the pyroelectric element is present.

One electrode of the element 1 is connected to the gate electrode of a junction field effect transistor (JFET) element 4. In this embodiment the JFET element 4 is in the form of an unencapsulated chip of a form as normally present in Texas Instruments BF 800–805 series and is also present within the same envelope as the element 1. However included within the scope of the invention is such a circuit arrangement in which the JFET element is formed by a commercially available encapsulated JFET which is present either within or external to the envelope containing the pyroelectric element.

In the present embodiment the pyroelectric element 1, diode elements 2 and 3, and JFET element 4 are provided as a hybrid microcircuit in a common envelope having three terminal connections represented as 6, 7 and 8 in FIG. 1. The terminal connections 6 and 7 are connected to the drain and source respectively of the JFET element and the terminal connection 8 is connected to the second electrode of the pyroelectric element 1.

In operational use in a full circuit arrangement the JFET constitutes the input of the amplifier means in which the high impedance on the input side is converted to a conventionally low output impedance.

The presence of the diodes 2 and 3 serves to restrict the input signal to the gate electrode of the JFET when the radiation input to which the detector element is sensitive is such that a very rapid change in temperature of the element occurs or a steady change in temperature at a slow rate occurs, and thereby inhibits the saturation of the amplifier means. With the particular diode elements described the voltage excursions of the element will be limited to approximately ±0.3 volt about the steady state value. In the case of relatively slow steady changes in temperature, for example, changes approaching 1° C. per minute or greater, in spite of there being a significant contribution to the noise due to the diodes, the detector is still functioning in the sense that the amplifier means is not in saturation as would be the case if the diodes were not present.

Figure 2:
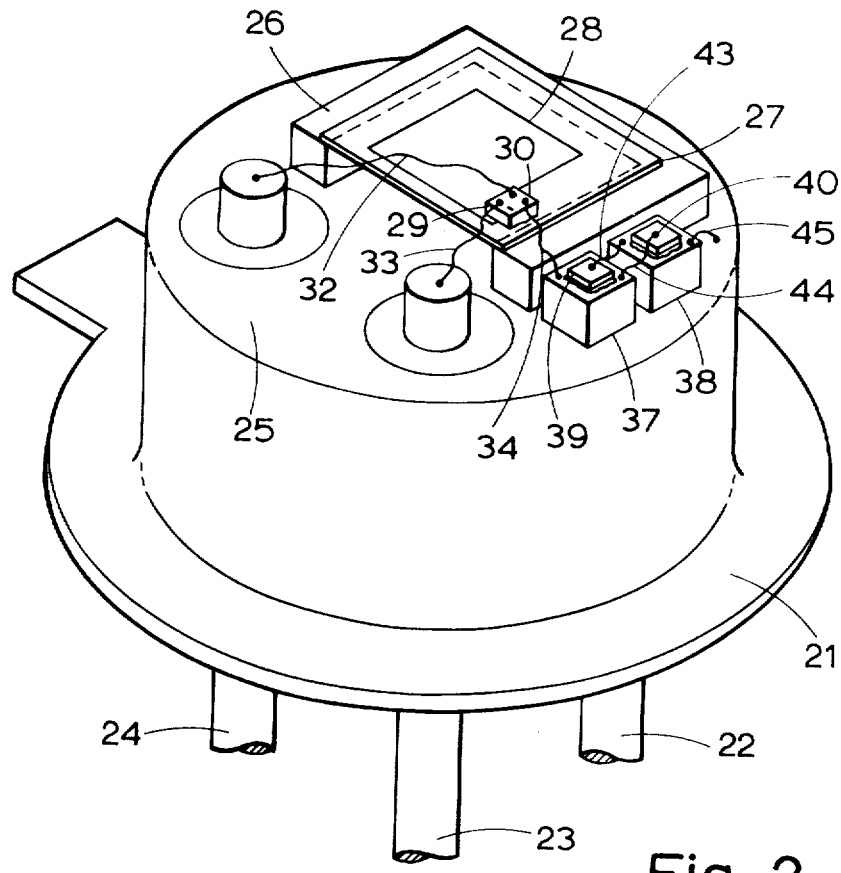
FIG. 2 is a perspective view of a detector device of the form present in the circuit arrangement shown in FIG. 1.

Referring now to FIG. 2 there is shown in perspective view a detector device as represented by the circuit diagram of FIG. 1. The device comprises an envelope having a three lead header 21 of TO-5 configuration as commonly used in the semiconductor art in which a lead 22 is connected to the main metal part of the header and leads 23 and 24 extend as posts through said metal part and are insulated therefrom by metal to glass seals. The metal part of the header is gold plated and on the upper surface 25 there is a U-shaped plinth member 26 of approximately 1 mm. thickness and consisting of a ceramic material having a gold coated surface. The plinth member 25 forms a support for a pyroelectric crystal of PLMZT having a thickness of approximately 35 microns and major surfaces of approximately 3.5 mm.×3.5 mm. On the lower surface of the element 27 there is an electrode of nichrome which forms an electrical connection to the pyroelectric gold coating on the plinth 26 and thus finally to the lead 22. On the upper surface of the element 27 there is an electrode 28 of nichrome having a generally rectangular portion of 2.0 mm.×2.0 mm. and a small rectangular portion 29 of 0.4 mm.×0.6 mm. extending at one corner. On the surface of the portion 29 of the electrode 28 there is secured by a conducting epoxy resin a JFET chip 30. In the chip 30 the substrate forms part of the gate electrode and at the upper surface there are source, drain and gate electrode bonding pads. The source and drain pads are connected by bonded wires 32 and 33 of gold of 25 microns diameter to the top surfaces of the posts formed at the ends of the leads 23 and 24. The gate pad is connected by a similarly bonded wire 34 to one side of a diode element as will be described hereinafter.

Adjacent the plinth member 26 there are two ceramic supports 37 and 38 of 1 mm.33 1 mm. and 0.3 mm. thickness secured by an epoxy resin to the surface 25 of the header 21. The upper surfaces of the supports 37 and 38 are metallised with gold. Diode chips 39 and 40 are secured by silver epoxy layers to the metallised surfaces of the supports 37 and 38 respectively. These diode chips 1 which are normally used in Mullard type BAV 45 each have their main electrodes located on opposite surfaces. Further bonded wires 43 and 44 connect the diodes in a reverse parallel configuration. Another wire 45 is present between the metallized surface on the support 38 and the surface 25 of the metal header. In practice the device is completed by a metal can welded to the rim of the header. The metal can has a window portion to allow the passage of radiation to be detected in the desired wavelength range so as to be incident on the upper surface of the PLMZT element 27.

Prior art detectors having a pyroelectric element, a JFET and a $3\times10^{10}$ ohm. gate leakage resistor, experience saturation of the amplifier for temperature slew rates as low as 0.1° C. per minute, whereas with a detector of the form as described with reference to FIG. 2 amplifier saturation did not occur even with rates of temperature slew of 3° C. per minute and higher.

Figure 3:
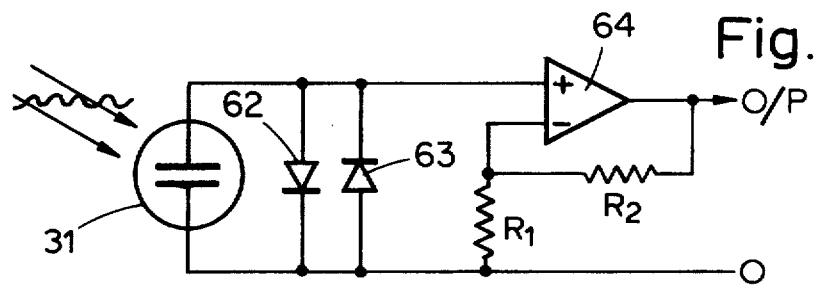
FIG. 3 is a circuit diagram of another arrangement in accordance with the first aspect of the invention.

FIG. 3 shows a circuit arrangement in accordance with the first aspect of the invention, including a pyroelectric element 31, diode elements 62 and 63, field effect transistor amplifier means 64 and resistors $R_1$ and $R_2$. In this circuit, the elements 31, 62 and 63 together with a JFET element forming part of the diagrammatically represented amplifier means 64 may be formed by a device of the form as previously described with reference to FIGS. 1 and 2. Alternatively, separate components may be employed with, for example, the elements 31, 62 and 63 corresponding substantially in properties to the elements 1, 2 and 3 as present in FIG. 1.

Figure 4:
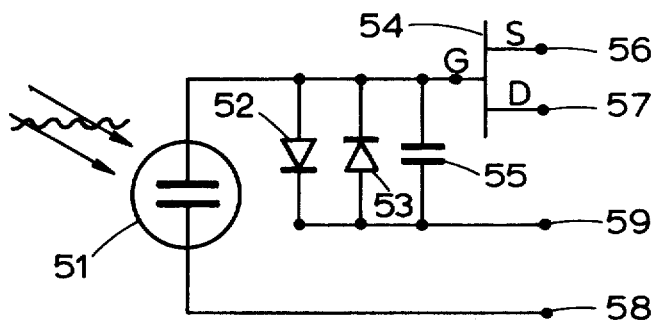
FIG. 4 is a circuit diagram of a further device in accordance with the second aspect of the invention and forming an arrangement in accordance with the first aspect of the invention.

Referring now to FIG. 4, in this circuit arrangement a pyroelectric element 51, diode elements 52 and 53 and a JFET element correspond exactly with the elements present in the detector device shown in FIG. 2. The circuit connection, however, is different in so far as the encapsulated device including said elements now has four terminals 56-59. The terminals 56, 57 and 58 correspond to the terminals 6, 7 and 8 in FIG. 1 and the leads 24, 23 and 22 in FIG. 2. The fourth terminal 59 is connected to one side of the diodes 52 and 53 and the interconnections within the detector device comprising the elements 51-54 are appropriately modified from those shown in FIG. 2.

Additionally a capacitor 55 is connected in parallel with the diodes. This arrangement enables the diodes and the capacitor, which in some forms of the invention may be omitted, to be incorporated in a feedback path between the output side of an amplification stage and the pyroelectric element. A circuit arrangement which may comprise such a detector device of the form shown in FIG. 4 is present in FIG. 5. In this circuit the JFET element is present in the diagrammatically shown amplifier means 64.

Figure 5:
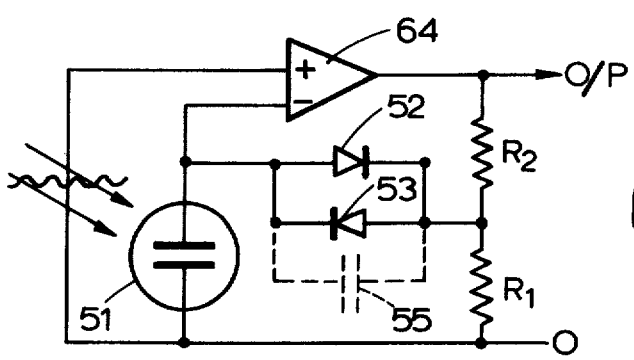
FIG. 5 is a circuit diagram of a further arrangement in accordance with the first aspect of the invention.

The capacitor 55, when present in a device as is shown in FIG. 4 and/or an arrangement as shown in FIG. 5, is used to set the gain of the JFET pre-amplifier and detector combination in conjunction with resistors $R_1$ and $R_2$ (FIG. 5). In this arrangement the voltage across the element 51 is maintained at zero volts. This may have the advantage of reducing noise from the element.

The D.C. voltage level at the output is proportional to the logarithm of the modulus of the rate of temperature change. This enables a wide range in the rate of temperature change to be detected. In a modified form when the capacitor 55 is replaced by a high value resistor the A.C. output voltage will be independent of frequency up to the roll-off frequency given by the feedback components.

Figure 6:
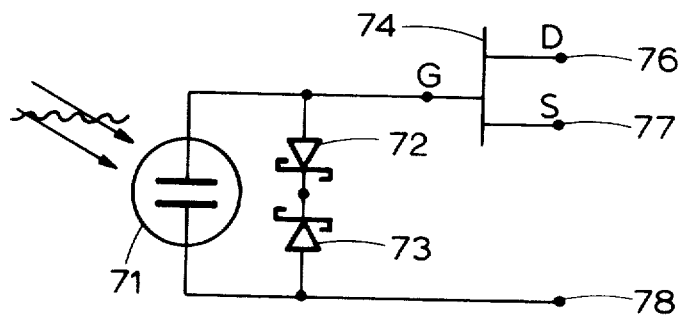
FIG. 6 is a circuit diagram of another device in accordance with the second aspect of the invention and forming an arrangement in accordance with the first aspect of the invention.

In the embodiment shown in FIG. 6 the radiation detector device comprises a pyroelectric element 71, two series connected Schottky diode elements 72 and 73 and a JFET element 74. The device has only three terminals 76, 77 and 78 and is constructed in the form of a hybrid microcircuit similar to the device shown in FIG. 2. The Schottky diode elements 72 and 73 are series connected back to back across the element 71.

The use of series connected Schottky diodes instead of parallel connected p-n diodes provides a larger operating range of voltages derived from the pyroelectric element before the current is limited, the Schottky diodes exhibiting characteristics resembling a resistance of constant value as opposed to a resistance which is changing logarithmically. In this manner a high degree of linearity is achieved up to the point at which the diodes start conducting at a high level. In addition there will be no appreciable increase in noise due to the low level conduction of the Schottky diodes until the onset of conduction at said high level.

What we claim is:

1. A circuit arrangement comprising a radiation detector element of pyroelectric material, field effect transistor amplifier means connected to the detector element to receive an input signal therefrom, said field effect transistor having a gate electrode, at least one ultra-low leakage non-linear device connected in a part of the circuit including the gate electrode of the field effect transistor amplifier means and the detector element, said non-linear device serving to limit the excursion in one direction of the input signal to the field effect transistor amplifier means and thereby inhibit saturation under conditions of large transients in radiation input or under conditions of progressive changes in radiation input of low magnitude.

2. A circuit arrangement as claimed in claim 1, which includes a pair of said non-linear devices comprising ultra-low leakage diode elements connected in the said part of the circuit including the gate electrode of the field effect transistor amplifier means and the detector element, said diode elements being connected in opposite sense thereby to limit the signal excursion both in said one direction and in the opposite direction.

3. A circuit arrangement as claimed in claim 2, wherein said pair of diode elements comprise parallel connected p-n diode elements.

4. A circuit arrangement as claimed in claim 3, wherein the diode elements are connected in parallel across the electrode terminals of the detector element, one of said electrodes being connected directly to the gate electrode of the field effect transistor means.

5. A circuit arrangement as claimed in claim 3 wherein the parallel connected diode elements are connected in a feedback path between an output terminal of the field effect transistor amplifier means and the detector element.

6. A circuit arrangement as claimed in claim 2, wherein said pair of diode elements comprise series connected Schottky diode elements.

7. A radiation detector device comprising an envelope, an element of pyroelectric material located within the envelope so as to receive the radiation to be detected, said pyroelectric element having first and second electrodes, a junction field effect transistor element situated in the envelope and having a gate electrode connected to the first electrode of the element of pyroelectric material, at least one ultra-low leakage non-linear device located within the envelope and electrically connected between said first electrode of the pyroelectric element and a terminal connection extending from the envelope, the field effect transistor having source and drain electrodes connected to first and second terminal connections extending from the envelope, and means connecting the second electrode of the element of pyroelectric material to a third terminal connection extending from the envelope.

8. A radiation detector device as claimed in claim 7 which includes a pair of said non-linear devices comprising ultra-low leakage p-n junction diode elements located within the envelope and electrically connected in reverse parallel between the first electrode of the element of pyroelectric material and one of said terminal connections extending from the envelope.

9. A radiation detector device as claimed in claim 8, wherein the reverse parallel diodes are connected between said first electrode and said third terminal connection.

10. A radiation detector device as claimed in claim 7 which includes a pair of said non-linear devices comprising ultra-low leakage Schottky diode elements located within the envelope and connected in series between the first electrode of the element of pyroelectric material and said third terminal connection.

11. A radiation detector device as claimed in claim 9, wherein the first electrode extends on one surface of the element of pyroelectric material and the transistor element comprises a chip mounted on a portion of said first electrode, the chip having a substrate forming a gate electrode of the transistor element.

12. A radiation detector device as claimed in claim 9, wherein the diode elements comprise individual chips mounted on at least one supporting body located within the envelope.

13. A radiation detector device comprising a pyroelectric element having first and second electrodes, an FET amplifier having a gate electrode connected to said pyroelectric element first electrode, and asymmetrical ultra-low leakage non-linear device means connected across said pyroelectric element first and second electrodes so as to limit the signal excursion in one direction of a signal supplied by the pyroelectric element to the gate electrode of the FET amplifier in a sense to oppose saturation of said FET amplifier.

14. A radiation detector device as claimed in claim 13 wherein said non-linear device means comprises first and second diodes connected in anti-parallel so as to limit the signal excursion in said one direction and in the opposite direction.

* * * * *